United States Patent [19]

Goode

[11] 3,978,465

[45] Aug. 31, 1976

[54] LINE ISOLATION MONITOR

[75] Inventor: John Park Goode, Fort Mitchell, Ky.

[73] Assignee: ESB Incorporated, Philadelphia, Pa.

[22] Filed: Oct. 25, 1974

[21] Appl. No.: 518,098

[52] U.S. Cl. ............................. 340/255; 317/18 R; 324/51

[51] Int. Cl.² ...................................... G08B 21/00

[58] Field of Search ...................... 340/255; 317/18; 324/51

[56] References Cited
UNITED STATES PATENTS

| | | | |
|---|---|---|---|
| 3,066,284 | 11/1962 | McKinley et al. | 340/255 |
| 3,710,238 | 1/1973 | Peterson | 324/51 |
| 3,737,765 | 6/1973 | Lee et al. | 324/51 |
| 3,754,221 | 8/1973 | Stelter | 340/255 |
| 3,757,169 | 9/1973 | Beresnikow | 317/18 R |
| 3,868,665 | 2/1975 | Treglown | 340/255 |

*Primary Examiner*—John W. Caldwell
*Assistant Examiner*—Daniel Myer
*Attorney, Agent, or Firm*—Anthony J. Rossi; Wm. Wharton Smith

[57] ABSTRACT

A line isolation monitor which monitors ground faults on a normally ungrounded AC power line. The monitor uses a low voltage sensing current having a frequency greater than the frequency of the power line. The monitor tests each side of the power line independently. Provision can be made to indicate a double fault to ground. Further refinements include a means to monitor the connection between the monitor device and ground as well as a means for confirming continuity of annunciator lines associated with the line isolation monitor.

9 Claims, 6 Drawing Figures

LINE ISOLATION MONITOR

BACKGROUND OF THE INVENTION

1. Field of the Invention

This invention relates to the field of ground detectors. Specifically it relates to the class of ground detector known as an active dynamic ground detector.

2. Description of the Prior Art

The need for ground fault detection in electric power distribution is as old as the power distribution art. Many devices have been proposed to aid the power supplier in sensing and finding such faults. In recent years, hospitals have found it desirable to use isolated power supplies for use in operation rooms, etc. so as to avoid as much as possible accidents resulting from electrical sparks, shocks, etc. To indicate that the isolated power supplies are actually free of grounds, line isolation monitors have been developed. A regulatory agency, National Fire Prevention Association (NFPA - 56, 1956), has set up standards for ground isolation in hospitals. To comply with the standards, a total leakage no greater than .002 amperes from line to ground is allowable. Included in this leakage figure is the capacitative leakage of the power supply itself, and the power required to drive the ground indicating device. With the limits on leakage as set up by NFPA, it is desirable that the driving power of the ground sensor be kept at as low a value as possible so that the growth of leakage below the allowable maximum can be watched. In general, the leakage contribution of many presently known ground fault detectors is of the order of 0.0005 amperes. With the limit of 0.002 amps total leakage for a system, the relatively high current draw of such devices prevents any accurate reading of the possible fault currents.

In a typical hospital installation, power is fed from the utilities lines to an isolation transformer. Non-grounded power lines from the isolation transformer feed one or more operating rooms, intensive care wards, etc. A line isolation monitor is connected to the non-grounded lines at any suitable spot. In a preferred installation, a signal is provided at each use area to advise that the power line is either: (a) free from grounds or (b) that a ground fault exists.

Presently known line isolation monitors can be classified into groups. One such classification is:
1. Passive static ground detectors
2. Active static ground detectors
3. Passive dynamic ground detectors
4. Active dynamic ground detectors In this classification, passive indicates that the device is operated by line power and active indicates that the device supplies a fault reading supply differing from the line power. Static refers to a system continuously connected to both sides of the power supply by a suitable bridge. Dynamic refers to a system which alternately senses one and then the other side of the isolated power line.

Line isolation monitors or ground detectors of groups 1, 2 and 3, are well known in the art. The general theories of fault detection have been completely worked out over the course of years. It is important to note that a single fault from one side of the power line to ground is comparatively easy to identify. However, when faults occur simultaneously on both sides of the power line and particularly when such double faults are identical or balanced in nature (such as the mid-point grounding of RFI suppressing capacitors) it becomes much more difficult to obtain a fault indication. In static systems, it is practically impossible to sense all types balanced faults.

The reliability of any safety device is of greatest importance and must be continually considered by the designer of safety apparatus. The designer must not only strive to use reliable parts and circuitry but he must also consider the results of component failure no matter how remote the chances are of such failure. Circuitry having a minimum of components operating in straight forward modes is preferred to more elaborate circuitry having a greater number of parts and having greater probability of failure.

SUMMARY OF THE INVENTION

A line isolation monitor comprises a fault detecting power supply having a frequency greater than the frequency of the power line to which it is attached. A first lead of the detecting power supply is connected via a capacitor alternately to the two leads of the power line. A resistor in parallel with a filter connects the second lead of the power supply to ground. The filter is chosen to pass current at the frequency of the power line thereby reducing the flow of fault current at the power line frequency through the resistor and increasing the sensitivity of the monitor to the fault detecting frequency. A current measuring device and a fault alarm are located across the resistor.

In a second embodiment, a means is provided to compare the fault currents from each lead of the power line to ground, and when they are equal, to increase the signal to the detection portion of the device. Circuitry may also be provided for monitoring the connection between the monitor and a permanently installed ground bus, and for monitoring the continuity of the lines connecting the isolation monitor to the several work stations fed by the isolated power lines.

From this description, it will be seen that the present invention relies on a composite test signal combining a higher frequency than the frequency of the power line with a power line frequency signal. By using a high frequency test signal, the size of the capacitor used to introduce the signal to the power line can be smaller than instances where the test signal is the same as the line frequency. This in turn results in a lower instrument leakage current and hence a more sensitive system.

The line isolation monitor of the invention corresponds to a mixed passive and active dynamic in the categories listed previously. Due to the use of the high frequency test signal, it is not necessary to measure phase shift, etc., as is done in certain previously known systems based solely on line frequency measurements.

DESCRIPTION OF THE PREFERRED EMBODIMENT

In the following description, simplified block diagrams will be used to illustrate the basics of the improved line isolation monitor. These will be followed by more complete circuitry diagrams. The blocks of the block diagram are included in the circuitry diagrams and bear the same identification in order to aid in the correlation between the two sets of figures.

Figure 1:
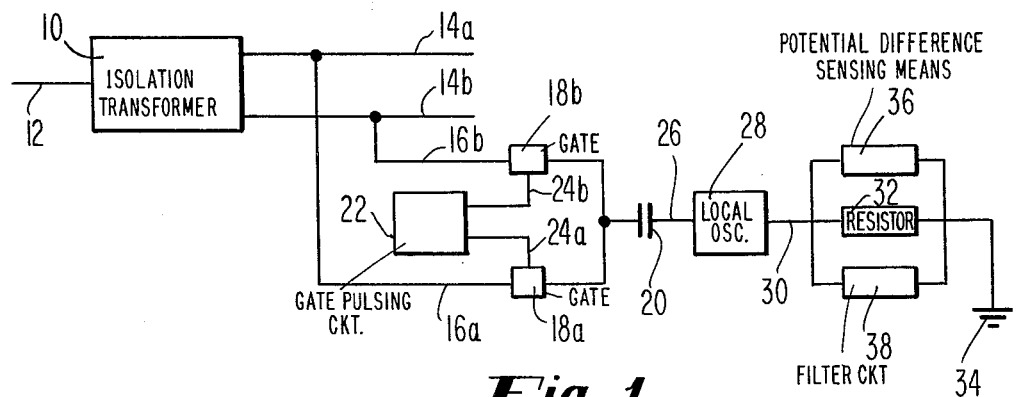
FIG. 1 depicts in block form the basic line isolation monitor of the invention.

In FIG. 1, isolation transformer 10 is fed by a utility line 12. A two wire isolated power line 14a, 14b, in most cases carrying 60 cycle 110 volt power, emerges from transformer 10 and is available for feeding operating room or other specialized equipment.

Fault sensing lead 16a connects power line 14a to a gate 18a and fault sensing lead 16b connects power line 14b to gate 18b. The output of gates 18a and 18b are led to one side of the fault current capacitor 20. A pulsing circuit 22 feeds gate 18a by lead 24a and gate 18b by lead 24b. The gate pulsing circuit causes the first gate and the second gate to cyclicly close and open at a chosen frequency, the first gate being closed during the periods that the second gate is open and the second gate being closed during the periods that the first gate is open. The frequency of the gate pulsing signals is not overly critical. It may be line frequency or somewhat lower or somewhat higher. The second terminal of capacitor 20 connects to one side 26 of the local oscillator 28. The local oscillator 28 provides an alternating current test signal having a frequency higher than the line frequency as for example in the neighborhood of 150–300 cycles per second and at for example, a voltage of about 14 volts (when the power line is at a nominal 120 volts). In a preferred embodiment, the local oscillator frequency is an irrational multiple of the line frequency. By this means, unwanted interaction between the two frequencies are avoided.

The second terminal of the test frequency power supply 28 is connected by lead 30 to resistor 32. The second terminal of the resistor connects to ground at 34. A means for sensing potential difference 36 across the resistor 32 serves to indicate the flow of fault current. A filter circuit 38, tuned to pass 60 cycle current, is placed in parallel with resistor 32. The filter 38 by-passes from resistor 32 most of the 60 cycle current flowing along the fault sensing circuit. The resulting current flowing through resistor 32 is about half 60 cycle and about half local oscillator current.

In the fault detecting circuits of the sort described, the detector itself represents a path from the isolated power line to ground. The magnitude of this path is determined by the total impedance of the detector circuit. For best sensitivity, it is desirable to have the paths as small as possible. In the present circuit, the impedance is of two values. The first is the impedance to the line frequency and is made up of the impedance of capacitor 20 along with the resistor-filter-indicator network 32, 36, 38. Because filter 38 is broadly resonant at approximately 60 cycles, the impedance of the circuit to 60 cycles is principally that of capacitor 20.

The second impedance value is that of the circuit at the local oscillator frequency. It is a feature of this invention to size the capacitor 20 so as to favor the passage of current at the local oscillator frequency and to suppress current at the line frequency. This is done by making capacitor 20 smaller than would be suitable for a 60 cycle signal only. By this means, the impedance to ground of the test circuit at 60 cycles is greater than that which would provide a useable test whereas at the local oscillator frequency and at a much lower and hence safer voltage, an amply strong test signal is provided.

As noted above, it is a feature of the present invention that the test frequency is greater than the line frequency. However, the test frequency must not be too high. This is because as the test frequency is increased, the difference in sensitivity of the circuit to resistive and capacitive faults becomes excessive. For a line frequency of 60 cycles, the practical bounds for the test frequency are between about 150 and 300 cycles per second, with an optimum at about 200 cycles. For higher or lower line frequencies, the test frequency limits would be in proportion to the above.

In selecting a test frequency, it is desirable that it be such as to avoid the formation of harmonic ratios or other undesirable interactions with the line frequency. This is accomplished by choosing for test frequency an irrational multiple of the line frequency. Taking account of the factors noted above, a test frequency of 211 cycles (a prime number and hence an irrational multiple of 60), would be a suitable choice.

By limiting the flow of 60 cycle current in the fault measuring circuit, the dependency of the measuring circuit on 60 cycle phase relationships is also limited. In practice, the fault current can be measured as a voltage drop across the resistor 32 without consideration of the phase angle. This in turn contributes to the simplicity and reliability of the fault detecting circuitry.

In operation, lines 16a and 16b are alternately connected to capacitor 20. Fault currents flow from the local oscillator 28 as well as from the power supply 10 through the external fault to ground and back via the resistor-filter-indicator circuit. The magnitude of the fault can be determined by a meter reading and if the fault is greater than a prechosen value, a suitable danger signal, alarms, etc. in the circuitry can be caused to activate.

Figure 2:
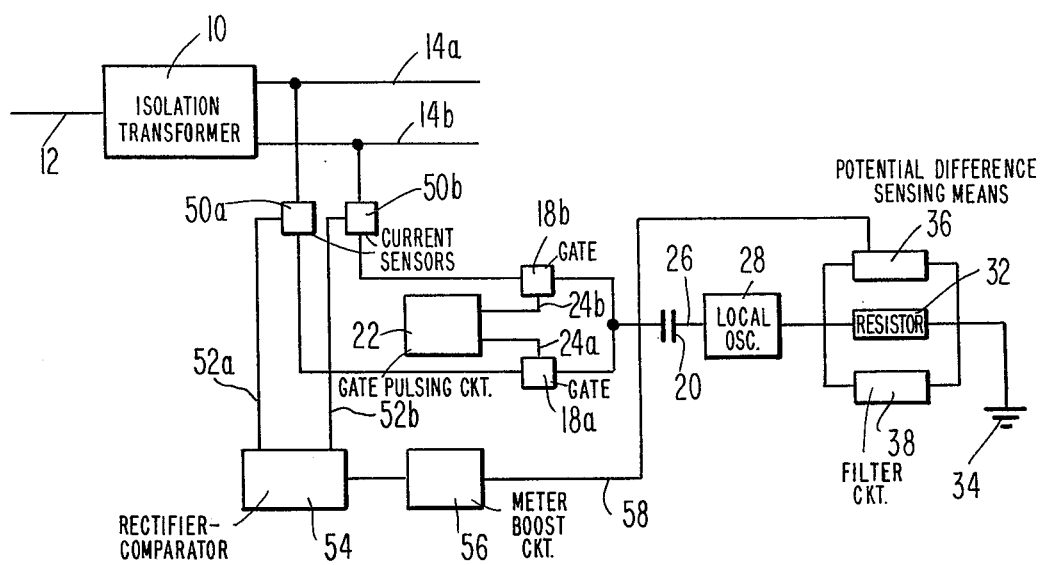
FIG. 2 depicts in block form a second embodiment of the invention.

FIG. 2, depicts a modification to the circuit of FIG. 1 to provide a balanced fault detecting means. This is useful in detecting a fault at the electrical midpoint of the isolated power circuit 14a, 14b.

When balanced faults occur, a portion of the fault current from the first fault is shunted from the monitor by the second fault and the line isolation monitor may not show a danger condition. It will, however, indicate some fault current. 50a represents a current sensor located in fault sensing lead 16a and 50b represents a current sensor located in fault sensing lead 16b. Output 52a from 50a and output 52b from 50b both lead to a rectifier and comparator 54. The output of rectifier and comparator is connected to a meter boost control 56, the output of which is connected to a second input to the indicating or alarm means 36. In the event of a balanced fault, the two current sensors 50a and 50b supply equal currents to the rectifier-comparator 54. In this device, the two currents are rectified and the DC voltages so produced are compared. If the two signals are different in magnitude as would occur with an unbalanced fault, an output is produced which is approximately equal to the difference of the two signals. If the two signals are equal, the output of the comparator is zero. The meter boost circuit 56 is such that when a signal current is received there is no output, and if there is no signal input, the output is a predetermined value. The output of the meter boost circuit 56 feeds an auxiliary terminal on the indicating or alarm means 36 causing it to increase its outputs and produce the needed danger indications and alarms.

Figure 3:
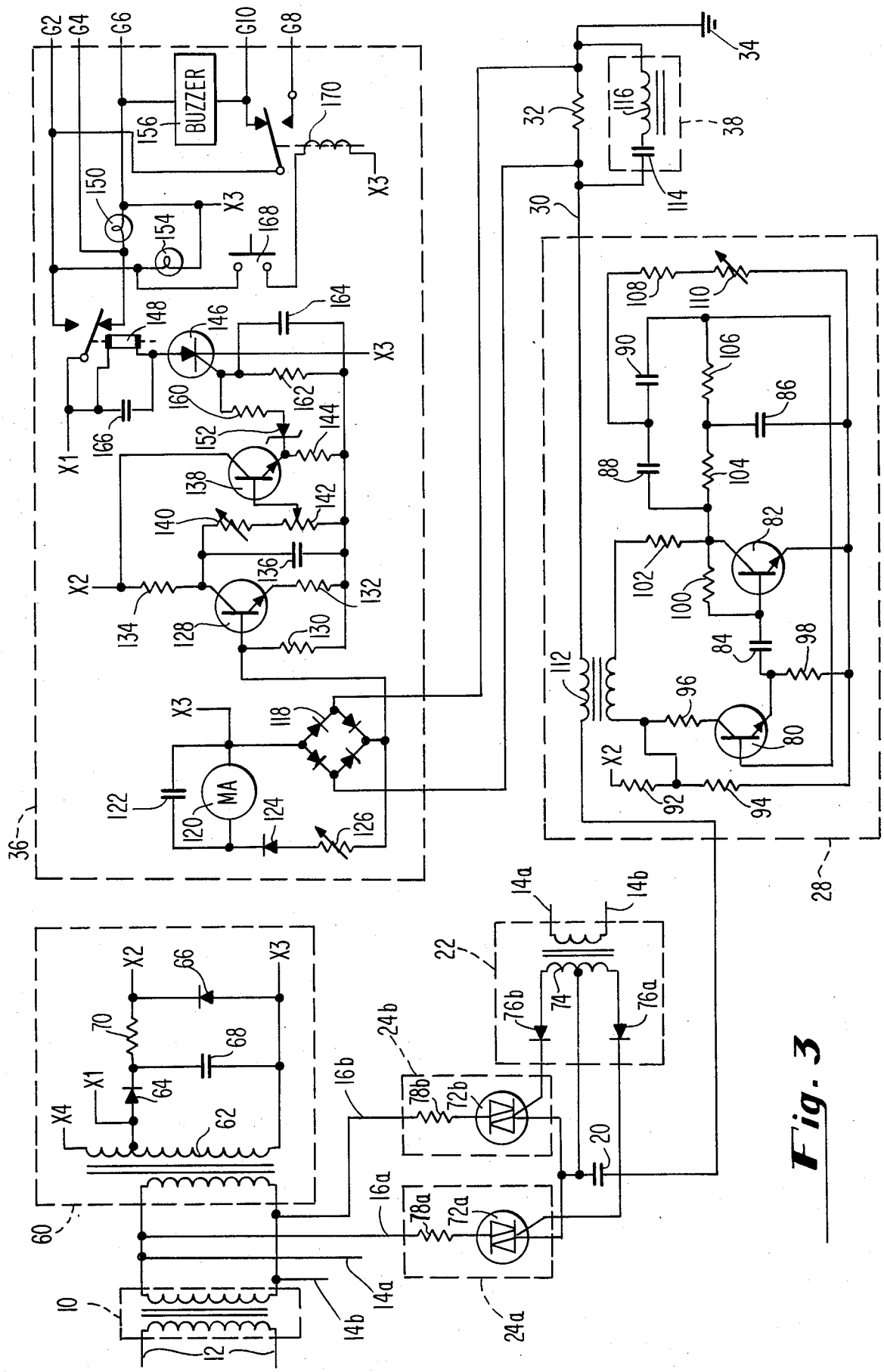
FIG. 3 depicts the detailed circuitry of the block diagram of FIG. 1.

A complete wiring diagram for the line isolation monitor of FIG. 1 is shown in FIG. 3. All of the numbered items of FIG. 1 are shown and similarly numbered. In addition to the blocks of FIG. 1, a monitor power supply 60 will be noted. This comprises transformer 62, rectifiers 64, 66, capacitor 68 and resistor 70. The output of the power supply is low voltage ac at X1, low voltage dc at X2 and return line X3.

The two gates 24a and 24b serving to connected fault sensing leads 16a and 16b to capacitor 20 are shown as two triacs 72a and 72b. The gate pulsing circuit 22 comprises center tapped transformer 74 and rectifier diodes 76a and 76b. The pulsing circuit shown sends alternate direct current pulses to gates 24a and 24b at a rate of 120 pulses per second. Resistors 78a and 78b are included in the fault sensing leads 16a and 16b to protect the gate circuitry against a dead short circuit in case one of the triacs should misfire. It will be noted that the pulser-gate circuitry provides contact to capacitor 20 over the period of peak voltage in each cycle of power circuit 14a, 14b.

Local oscillator 28 comprises a "parallel T" circuit as is well known in the art. It includes transistors 80 and 82 capacitors 84, 86, 88 and 90, and resistors 92, 94, 96, 98, 100, 103, 104, 106, 108, and 110. Resistor 110 is variable and controls the frequency of the local oscillator. A preferred frequency for this oscillator is in the neighborhood of 200 cycles. Power from the local oscillator is fed to capacitor 20 by transformer 112. Fault currents at both line frequency and local oscillator frequency flow through line 30, resistor 32 to ground 34. Filter 38 shown as comprising capacitor 114 and inductance 116 bypasses most of the 60 cycle component around resistor 32.

The flow of fault current across resistor 32 is measured by the means for sensing potential difference 36. In the circuit shown, the alternating potential difference between the terminals of resistor 32 is rectified to a direct current potential by the rectifier bridge 118. The output of 118 is fed to a galvanometer movement 120 calibrated for convenience in milliamperes of leakage. A capacitor 122 serves to filter the signal supplied to meter 120. A diode 124 protects the alarm circuit from the effects of direct discharge of capacitor 122. A variable resistor 126 may be used to adjust the sensitivity of meter 120. The output of bridge 118 is also fed to an alarm circuit. This comprises driver transistor 128 with resistors 130, 132 and 134 and capacitor 136 for driving the emitter-follower transistor 138. Resistors 140, 142 and 144 complete the emitter-follower circuit. Variable resistors 140 and 142 may be used for coarse and fine adjustment of the amplification ratio of transistor 138.

Under normal conditions, silicon control rectifier 146 is in a conductive mode. This allows power to flow from X1 through the coil of relay 148 holding the contact to line G6 closed. This energizes the green or "normal" light 150. However, when the transistor 138 becomes sufficiently conductive due to voltage drop in resistor 32, the breakover point of zener diode 152 is reached. When this occurs, the SCR 146 is turned off, relay 148 opens activating red alarm light 154 and buzzer 156. Resistors 160 and 162 set the voltage seen by zener diode 152. Capacitor 164 suppresses transients that otherwise might inadvertently fire SCR 146.

Capacitor 166 serves to provide a long time constant for the opening of relay 148 and to prevent transient operation of the same. Pushbutton 168 with relay 170 can be used to manually lock out the buzzer 156 once an alarm signal has been given. The several lines G2, G4, G6, G8 and G10 provide means for presenting the monitor information to a remotely located station.

Figure 4:
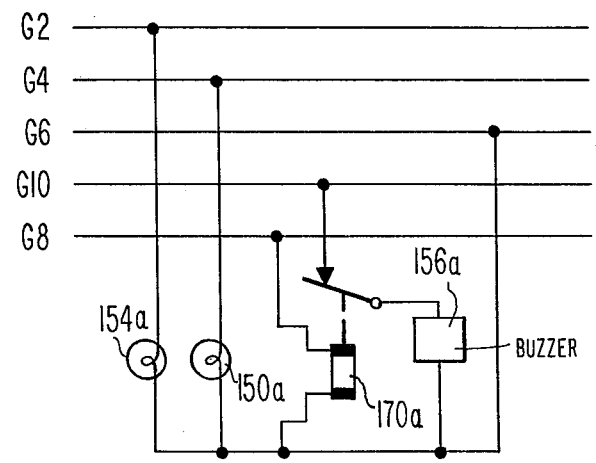
FIG. 4 depicts the circuitry of a remote station for use with the circuit of FIG. 3.

A typical remote station is shown in FIG. 4. The 5 control lines G2–10 are shown passing along the top of the figure to a plurality of remote stations. At each station, there is a green light 150a, a red light 154a, a relay 170a and a buzzer 156a. These are connected as shown so that each component is in parallel with and gives the same indication as the similar component in the master station of the line isolation monitor.

Although solid state devices are notable in their reliability, failure is still a possibility. Failure, when it occurs, may be either in a conductive or non-conductive mode, the latter being the most likely. In the circuit of FIG. 3, there are three solid state devices, transistors 128, 138 and SCR 146 whose failure might nullify the functions of the monitor. It is to be noted that the non-conductive failure of transistor 138 or SCR 146 will result in the de-energizing of relay 148 causing the alarm lamp 154 to light and so advising the user of a dangerous condition.

Figure 5:
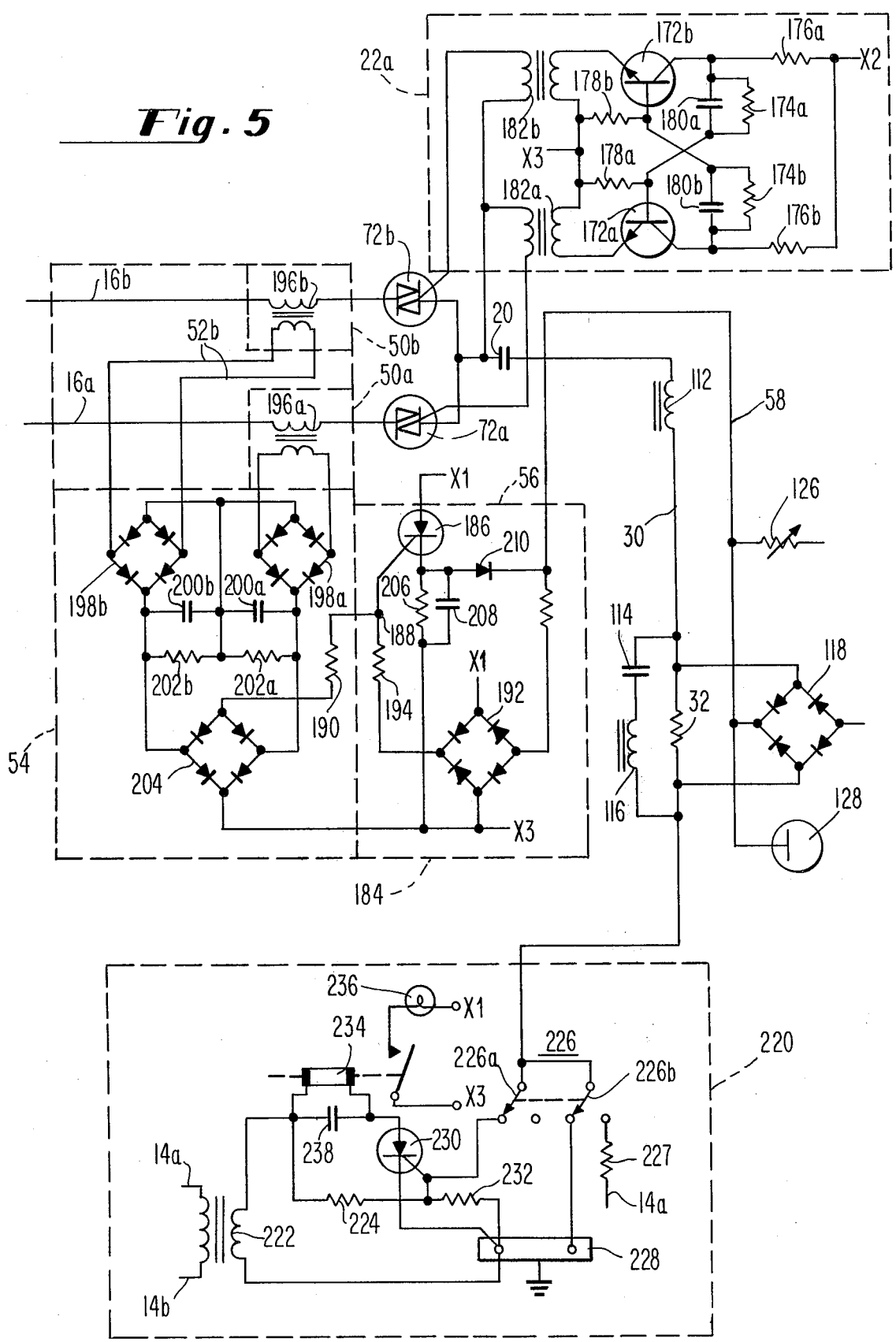
FIG. 5 depicts the circuitry of FIG. 2 as well as the circuitry of two additional refinements; and, FIG. 6 depicts the circuitry of an improved master and remote line isolation monitor indication stations.

FIG. 5 illustrates the inclusion of additional circuitry to the basic monitor of FIG. 3. For purposes of simplicity, only those parts of FIG. 3 are included in FIG. 5 that are necessary for an understanding of the added circuitry.

In FIG. 5, block 22a represents an alternative gate pulsing circuit using a multivibrator. In this circuit, transistors 172a, 172b are alternately fired resistor capacitor triggers, 174a, 176a, 178a, 180a and 174b, 176b, 178b and 180b. The output of transistor 172a feeds pulses via transformer 182a to triac 72a and the output of transistor 172b feeds alternate pulses to triac 72b. This multivibrator circuit 22a has the advantage over pulse circuit 22 of having a pulse frequency independent of the line frequency. The frequency may be greater or less than line frequency. However, it must not be higher than the local oscillator frequency and it should not be so low as to cause the needle of the meter 120 to oscillate.

When the line isolation monitor of FIG. 3 is faced with two electrically balanced faults, there is sufficient bypass by the two faults to prevent the monitor from giving a proper indication of the fault magnitude. A truly balanced double fault is a very rare occurrance, however, the present circuitry can be modified to properly monitor even this situation.

Block 184 illustrates a circuit for increasing the response of the monitor when a balanced fault occurs.

SCR 186 is controlled by the potential at point 188. This point receives voltages from three sources: a fixed voltage from X1, a variable voltage of the same polarity from rectifier 118 via line 58 and an overriding potential from resistor 190. The first two voltage are combined by the bridge 192 and feed point 188 through resistor 194. Transformers 196a and 196b sense any fault currents flowing in lines 16a and 16b. The output of the transformers is rectified by full wave rectifiers 198a and 198b respectively. The output of the rectifiers is stored in capacitors 200a and 200b. Leak resistors 202a and 202b bleed off the capacitors so that their charge always represents the conditions of the moment. The charges of condensers 200a and 200b are matched by bridge 204. The output of bridge 204 is a voltage of constant polarity equal to the difference of the two charges on the two capacitors. If the two charges are equal, the output voltage of 204 is zero. In the ordinary situation where such faults as these are not balanced, the charges are not equal and a potential is delivered to point 188 via resistor 190 that is opposite in sign to and of a magnitude sufficient to override the voltage received from resistor 194. The polarity of the signal from 190 is such as to keep SCR 186 in a non-conductive condition. However, if the faults sensed by the monitor are balanced, resulting in a null output from 204, the control of SCR 186 is given to the output of 192. The voltage of 192 due to the line X2 is not in itself sufficient to fire 186. However, when there is an appreciable potential from line 58 (nearly of alarm magnitude), the combined potential is sufficient to fire 186. This causes a continuous limited current to flow back line 58 increasing the reading on meter 120 to an alarm value and causing the alarm circuit to activate. Resistor 206 sets the output voltage of 196 with respect to X1, capacitor 208 filters the output of 186 and diode 210 prevents feed of current from 118 to 206.

The integrity of a line isolation monitor depends, among other things, on the connection to ground. A ground monitor loop is shown in block 220. This loop serves to monitor the ground connections included within the loop. It has been found by experience that this includes the area where the greatest possibility of ground loss exists. Normally, current from transformer 222 flows through resistor 224, first contact 226a and second contact 226b of test switch 226 to ground bus 228 and back to 222. Under normal conditions, the gate of SCR 230 is held at ground potential due to the circuit passing through 226a and 226b to ground. If, however, there is a break in the loop from the gate through 226a and 226b, a voltage will appear across resistor 232 sufficient to trigger SCR 230 causing relay 234 to close and energize an alarm such as light 236. Capacitor 238 serves to smooth the operation of relay 234.

The test switch 226 is used to impose an artificial fault into the circuit. When this switch is depressed, the ground connection is broken and a fault current fed from the power line as shown by 14a, reduced to a threshold value by resistor 227 is inserted. If the line isolation monitor is operative, a fault will be indicated upon depression of the test switch.

Figure 6:
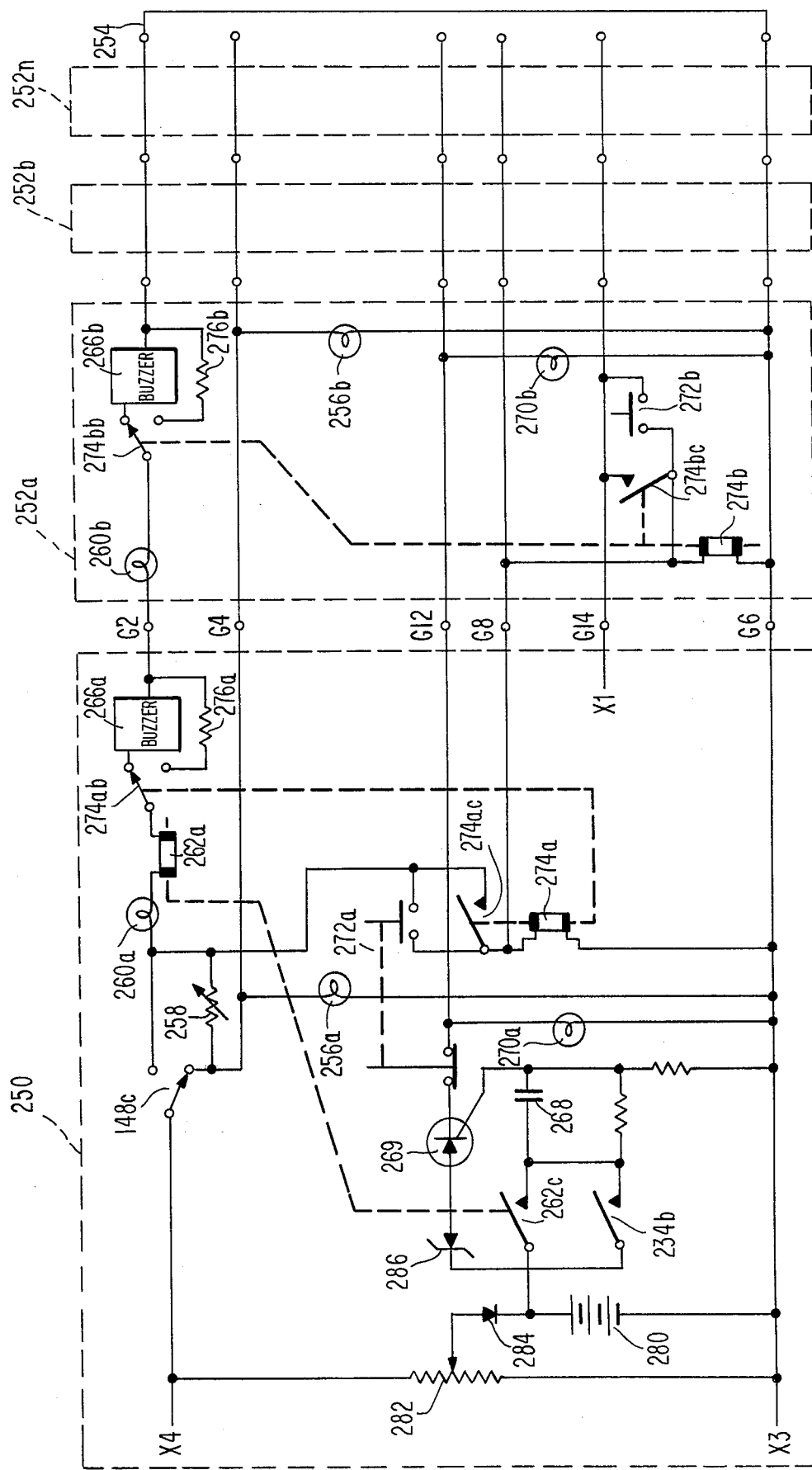

A further embodiment of the monitor for monitoring the continuity of the alarm circuit is shown in FIG. 6. In this diagram, four blocks are shown, a master unit 250, a first remote station 252a and additional remote stations 252b and 252n. Remote stations may be added or removed as needed. The circuitry of the remote stations is identical except for the Nth unit. The Nth unit includes a loop completion link 254.

A power line X4 feeds to relay contacts 148C. These contacts are operated by relay 148 of FIG. 3. In the normal position, power from X4 is fed to line G4. A green light 256a is fed from this line indicating that the line isolation monitor is operating and that no fault exists. Current also passes via variable resistor 258 through light 260a to 260m, relay coil 262a, contacts 274ab to 274nb, and buzzer coils 266a to 266n. The current is adjusted by resistor 258 to a value low enough that lights 260 do not glow and buzzers 266 do not sound but high enough to energize relay 262. The contacts 262c of this relay close when the relay is deenergized. If the loop G2-254-G6 should be opened, inactivating the monitor system, relay 262 will drop, causing its contacts 262c to close. Current will than flow through capacitor 268 causing SCR 269 to fire which energizes the series of "Trouble" lights 270a to 270n. If a fault is sensed by the line isolation monitor, relay 148 will be energized closing contacts 148C. This permits full current to flow through red alarm lights 260a to 260n and cause buzzers 266a to 266n to sound. At the same instant, green "Normal" lights 256a to N are extinguished. It may be desirable under certain conditions to silence the several buzzers in the alarm circuit. When silence button 272a is pushed, relay 274a is energized changing the contacts 264a so as to bypass buzzer 266a with resistor 276a. Contact 274ac causes relay 274a to remain closed. At the same time, relays 274b to 274n are energized so as to bypass all the remaining buzzers.

If there is a break in the ground connection, relay contact 234b will close causing warning lights 270a – n to light as described above.

A buzzer in a remote station may be silenced by closing its silence button 272b to n, also silencing the other buzzers. Closing 272b for example energizes relays 274b to 274n causing contact 274bc to close and hole the relay. This also switches contacts 264b so as to silence buzzer 266b.

In the embodiment shown in FIG. 6, the power supply for SCR 269 and trouble lights 270a, to n is the storage battery 280. In the event of loss of power to the line isolation monitor, the current flow in the alarm circuit loop will cease. This causes relay 262 to open closing contacts 262c, firing SCR 269 and activating the trouble alarm lights 270a, b, n. Battery 280 is normally kept charged by a charging circuit such as shown by dropping resistor and voltage divider 282 and rectifying diode 284. A voltage limiter such as zener diode 286 can be placed in the feed to SCR 280 to prevent overdischarge of the battery 280.

From this description, it will be seen that the circuitry of the line isolation monitor of the invention utilizes a minimum of components. Means are provided to check the operability of the monitor as well as means for checking the continuity of several principal circuits. Additional circuitry is shown for indicating the presence of ground faults at one or more points remote from the monitor.

Having fully disclosed my invention and described in detail its preferred embodiments, I hereby claim:

1. A line isolation monitor for sensing the presence or absence of faults to ground from a nominally isolated power line carrying alternating current of a first frequency, the power line having a first conductor and a second conductor which comprises:
 a. a capacitor having a first terminal and a second terminal;
 b. a first gate having a power input and a power output, the power input being connected to the first conductor and the power output being connected to the first terminal of the capacitor, the first gate further having a control input;
 c. a second gate having a power input and a power output, the power input being connected to the second conductor and the power output being connected to the first terminal of the capacitor, the second gate further having a control input;
 d. a means for pulsing the gates operably connected to the control inputs of the first gate and second gate, the means for pulsing causing the first gate and the second gate to cyclicly close and open at a second frequency, the first gate being closed during the periods that the second gate is open and the second gate being closed during the periods that the first gate is open;

e. a source of alternating current having a third frequency, the third frequency being greater than the second frequency and greater than the first frequency, the source of alternating current having a first output terminal and a second output terminal, the first output terminal being connected to the second terminal of the capacitor;

f. a resistor having a first terminal and a second terminal, the first terminal being connected to the second output terminal of the source of alternating current and the second terminal being connected to the ground;

g. a means for bypassing alternating current, the means for bypassing having a first terminal and a second terminal, the first terminal being connected to the first terminal of the resistor and the second terminal of the means for bypassing being connected to the second terminal of the resistor, the means for bypassing being substantially conductive to alternating current of the first frequency and substantially non-conductive to alternating current of the third frequency; and, h. a means for sensing a potential difference, the means for sensing having a first terminal and a second terminal, the first terminal being connected to the first terminal of the resistor and the second terminal being connected to the second terminal of the resistor.

2. A line isolation monitor as defined in claim 1 further including a balanced fault detecting means which comprises:

a. first current sensor having a current input, a current output and a signal output, the current input being connected to the first conductor of the power line and the current output being connected to power input of the first gate;

b. a second current sensor having a current input, a current output and a signal output, the current input being connected to the second conductor of the power line and the current output being connected to the input of the second gate;

c. a means for rectifying and comparing, the means for rectifying and comparing having a first input, a second input and an output; the first input being connected to the signal output of the first current sensor and the second input being connected to the signal output of the second current sensor; the means for rectifying and comparing providing a positive signal when the input from the first current sensor differs from the input from the second sensor, and a null signal when the two inputs are equal; and d. a means for boosting the output of the means for sensing potential, the means for boosting having an input and an output, the input connected to the output of the means for rectifying and comparing and the output connected to the means for sensing potential, the means for boosting providing a signal when a nul signal is received and its input;

so that when signal received by the first sensor differs from the signal received by the second sensor no sigal is given to the means for sensing potential difference and when the signal received by the first sensor is equal to the signal received by the second sensor a signal is given to the means for sensing potential difference.

3. A line isolation monitor as defined in claim 1 wherein the first frequency is 60 cycles per second and the third frequency is between 150 and 300 cycles per second.

4. A line isolator monitor as defined in claim 1 wherein the third frequency is an irrational multiple of the first frequency.

5. A line isolation monitor as defined in claim 1 including at least one means remote from the monitor for indicating line isolation faults, the means remote from the monitor operatively connected to the monitor by a circuit.

6. A line isolation monitor as defined in claim 5 including a means for indicating loss of continuity of the circuit connecting the means remote from the monitor to the monitor.

7. A line isolation monitor as defined in claim 5 including a means for indicating at the means remote from the monitor the loss of power to the monitor.

8. A line isolation monitor as defined in claim 1 including a means for providing an artificial line fault.

9. A line isolation monitor as defined in claim 1 including a means for indicating the absence of a ground connection.

* * * * *